United States Patent [19]

Iwahashi et al.

[11] Patent Number: 4,639,895
[45] Date of Patent: Jan. 27, 1987

[54] SEMICONDUCTOR MEMORY DEVICE

[75] Inventors: Hiroshi Iwahashi; Kiyofumi Ochii, both of Yokohama, Japan

[73] Assignee: Tokyo Shibaura Denki Kabushiki Kaisha, Kawasaki, Japan

[21] Appl. No.: 497,135

[22] Filed: May 23, 1983

[30] Foreign Application Priority Data

May 28, 1982 [JP] Japan .................................. 57-89891

[51] Int. Cl.$^4$ ................................................ G11C 7/00
[52] U.S. Cl. .................................................... 365/200
[58] Field of Search ........................... 365/200; 371/10

[56] References Cited

U.S. PATENT DOCUMENTS

| 4,354,217 | 10/1982 | Mahon | 365/200 |
| 4,392,211 | 7/1983 | Nakano et al. | 365/200 |
| 4,473,895 | 9/1984 | Tatematsu | 365/200 |

OTHER PUBLICATIONS

Kokkonen et al., "Redundancy Techniques for Fast Static RAMs," ISSCC Digest of Technical Papers, pp. 80–81, Feb. 18, 1981.

Primary Examiner—James W. Moffitt
Attorney, Agent, or Firm—Finnegan, Henderson, Farabow, Garrett & Dunner

[57] ABSTRACT

A semiconductor memory device is comprised of: a semiconductor memory having a plurality of memory cells arrayed in a matrix, a memory area of the memory including a main memory section and an auxiliary memory section; a plurality of row lines for selecting the memory cells connected to the memory cells; a plurality of power source lines provided corresponding to the row lines; and a circuit for separating or disconnecting from a power source the power source lines connected to the memory cells in an unused memory area of the semiconductor memory.

5 Claims, 16 Drawing Figures

SEMICONDUCTOR MEMORY DEVICE

BACKGROUND OF THE INVENTION

The present invention relates to a semiconductor memory device with an improved yield.

In the manufacture of semiconductor memory devices, together with an increase in the memory capacity of the device, the probability of occurrence of error bits also increases. Semiconductor memory cells containing error bits have always been regarded as defective memory devices, and discarded as such. This discarding of defective memory devices results in an increase of manufacturing costs and a waste of material.

In recent years, to remedy such defects, some measures have been taken to save defective memory devices. One example of such a measure would be to provide an auxiliary memory in addition to a main memory, so that, when the main memory contains an error bit, the auxiliary memory is used in place of the error bit, thus saving the defective main memory. In other words, this example provides a redundancy function for the main memory containing the error bit by the provision of the auxiliary memory.

Figure 1:
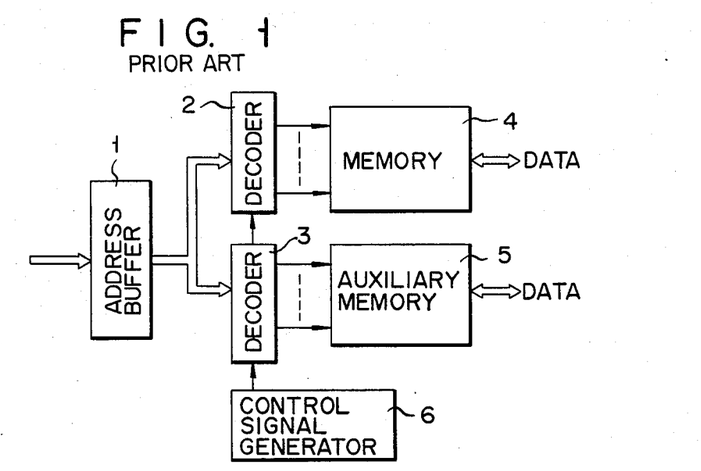
FIG. 1 shows a block diagram of a configuration of a prior semiconductor memory device containing an auxiliary memory.

A schematic illustration of the semiconductor memory device with such an auxiliary memory is given in FIG. 1. In the figure, an output signal from an address buffer 1 is applied to a main address decoder 2 and an auxiliary address decoder 3. A decoded output of the main address decoder 2 is applied to a main memory 4, thereby selecting one of the row lines in the main memory. Then, data is written into or read out from the memory cells coupled with the row lines selected, by a write signal or a read signal. The main address decoder 2 is controlled in its decode operation by the output from the auxiliary address decoder 3. The decoded output in the auxiliary address decoder 3 is applied to the auxiliary memory 5 to select one of the row lines in the auxiliary memory 5. Then, data is written into the memory cell connected to the selected row line using a write signal and read out of the same by a read signal.

The auxiliary address decoder 3 is so programmed that when the main memory 4 contains an error bit cell, it produces the decoded output corresponding to the address of the error bit cell. Therefore, when an error bit cell in the main memory 4 is selected, the output of the auxiliary decoder 3 selects the auxiliary memory 5. In this specification, "an error bit cell is selected" means "a row line connected to an error bit cell is selected", for ease of explanation. Similarly, "an auxiliary memory 5 is selected" is used to mean "a row line connected to the memory cell of the auxiliary memory 5, which is used in place of the error bit cell in the main memory, is selected".

The auxiliary address decoder 3 operates under the control of an error bit replacement control signal generator 6 for generating a control signal for error bit replacement. The error bit replacement control signal generator 6, which includes nonvolatile memory elements, stores the information which, when an error bit is contained in the main memory 4, operates the auxiliary decoder so as to select the bit cell of the auxiliary memory 5 in place of the error bit cell. The control signal generator 6 outputs a control signal for the error bit replacement to the auxiliary address decoder 3 on the basis of the information, thereby controlling the operation.

In the semiconductor memory device thus arranged, when no error bit cell is present in the main memory 4, no control signal is produced and only the main memory operates to select a correct bit cell. The phrase "a correct bit cell is selected" means "a row line connected to a correct bit cell is selected". When the error bit cell is contained in the main memory, the auxiliary address decoder 3 selects a memory cell in the auxiliary memory 5. Further, at this time, the decoded output of the auxiliary address decoder 3 stops the decoding operation of the main address decoder 2, blocking access to the main memory 4. Through this operation, the error bit cell in the main memory 4 is replaced with a memory cell in the auxiliary memory 5.

Figure 2A:
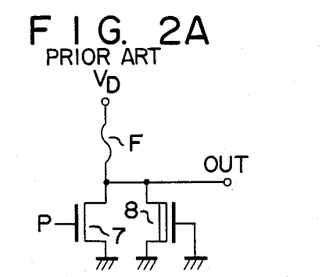
FIGS. 2A and 2B respectively show practical circuit arrangements of two examples of an error bit cell replacement control signal generator incorporated in the memory device of FIG. 1.
Figure 2B:
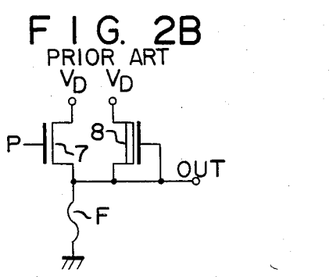

FIGS. 2A and 2B show circuit diagrams of two examples of the error bit replacement control signal generator 6. In the example of FIG. 2A, a fuse element F made of polysilicon as a nonvolatile memory element is inserted between a power source VD and an output terminal Out. A programming enhancement-type MOS transistor 7 is inserted between the output terminal Out and ground. A depletion-type MOS transistor 8 is inserted between the output terminal Out and ground. A programming signal P is applied to the gate of the MOS transistor 7. The MOS transistor 8 is connected to ground. In the circuit shown in FIG. 2B, a programming enhancement-type MOS transistor 7 is inserted between a power source VD applying point and an output terminal Out. A depletion-type MOS transistor 8 is inserted between the VD applying point and the output terminal Out. A fuse F is connected between the output terminal Out and ground. A programming signal P is applied to the gate of the MOS transistor 7 and the gate of the MOS transistor 8 is coupled to the output terminal Out.

In the circuit shown in FIG. 2A, when the fuse F is not burned out, a signal level at the output terminal Out is kept at logical "1" since a resistance ratio of the MOS transistor 8 to the fuse element F is extremely large. On the other hand, when it is burned out, the output terminal Out is grounded through the MOS transistor 8 and kept at logical "0". To melt the fuse F, a programming signal P of logical "1" is applied to the gate of the MOS transistor 7. The application of the programming signal P turns on the MOS transistor 7 to allow a large current to flow through the fuse F. Joule heat generated at this time burns out the fuse F. When the fuse F is burned out, the signal P is again logical "0" to cut off the MOS transistor 7. When a signal at the output terminal Out, i.e., the error bit replacement control signal, is logical "1", for example, the decoding operation of the auxiliary address decoder 3 is stopped. When it is logical "0", for example, the decoding operation is performed.

In the circuit shown in FIG. 2B, unlike the circuit shown in FIG. 2A, when the fuse F is not burned out, a signal level at the output terminal Out is kept at logical "0" due to a resistance ratio of the MOS transistor 8 to the fuse F. When it is burned out, the output terminal Out is connected to the power source VD via the MOS transistor 8, and is at logical "1". To burn out the fuse F, a programming signal P of logical "1" is applied to the gate of the MOS transistor 7. Upon application of the programming signal P, the MOS transistor 7 turns on to allow a large current to flow through the fuse F. In this circuit, when the signal at the output terminal Out, or the control signal, is logical "0", the decoding operation of the auxiliary address decoder 3 is stopped; when it is logical "1", the decoding operation is performed.

Figure 3:
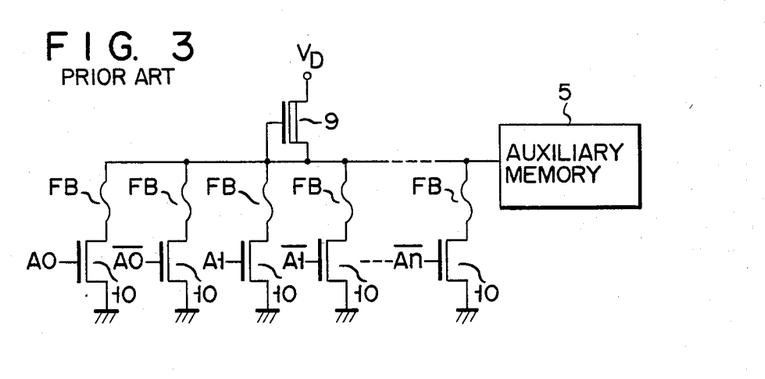
FIG. 3 shows a practical circuit arrangement of a prior art decoder circuit for the auxiliary memory.

FIG. 3 shows a configuration of the auxiliary address decoder 3 when no error bit replacement control signal generator 6 is used. The auxiliary address decoder comprises a depletion-type MOS transistor 9, a plurality of drive MOS transistors 10 of the enhancement type, having at their inputs address signals A0, $\overline{A0}$, A1, $\overline{A1}$, . . . An produced from the address buffer 1, and a plurality of fuses FB inserted between the MOS transistors 10 and 9.

The auxiliary decoder is so programmed that, of the memory cells of the memory 4, if a memory cell selected by the address signals A0=A1=...=An=0 is an error bit cell, it produces a decode output corresponding to the address. This programming is performed by burning out the fuse FB connected to the MOS transistor 10 receiving the address signals $\overline{A0}$, $\overline{A1}$, ... An at the gate. When the auxiliary address decoder is so programmed, upon the inputting of the address signals A0=A1=...=An=0, a memory cell is specified in the auxiliary memory.

In the auxiliary address decoder shown in FIG. 3, it is necessary to burn out the plurality of fuses FB determined by the contents of the address signal input for selecting the auxiliary memory. These fuse elements are melted by Joule heat from a laser or the current as mentioned above. However, this melting method involves some problems: sticking of melted material to the peripheral circuit, reduction of the reliability of the memory device, or erroneous programming due to a melting failure, or poor reliability of the melted portion. Therefore, in order to avoid these probelms it is evident that the number of melting portions should be as small as possible. With recent progress in discrete fabricating techniques for integrated circuits, the memory capacity has been increased and hence, the number of bits of an address input has also increased. Thus, the number of fuse elements burned out when the auxiliary memory is used increases. For this reason, an immediate solution to the above-mentioned problems has been eagerly desired.

Figure 4:
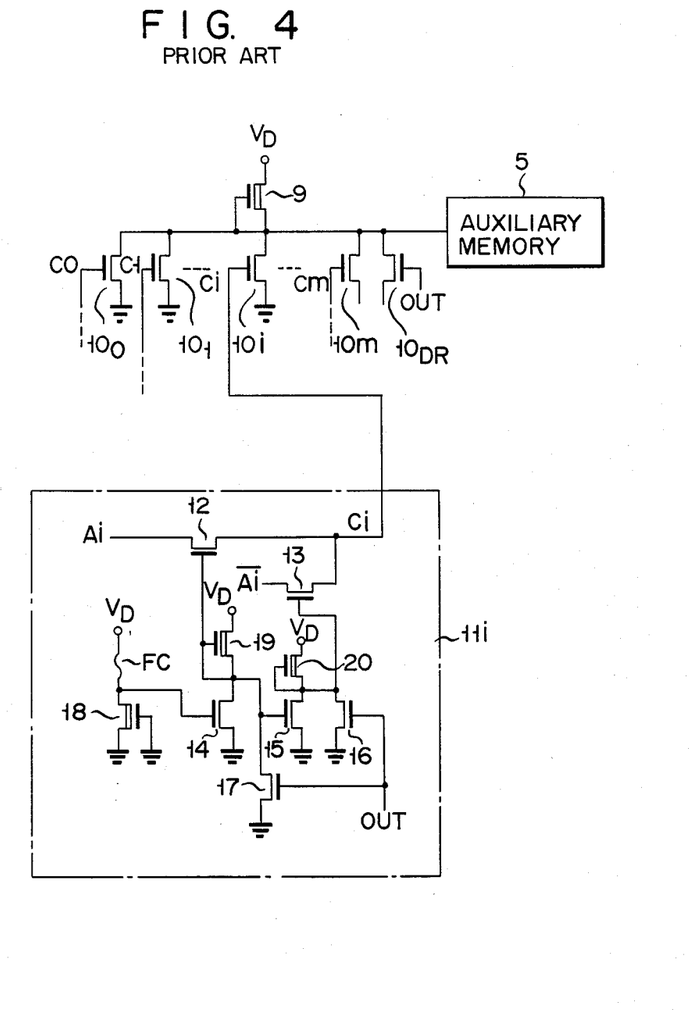
FIG. 4 shows a practical circuit arrangement of another prior semiconductor memory device containing an auxiliary memory.

FIG. 4 shows another embodiment of a prior auxiliary memory. This auxiliary decoder does not use the fuse elements FB used in the auxiliary decoder of FIG. 3 but uses programming circuits instead. The programming circuits are respectively provided for the drive transistors 10 in a one-to-one corresponding manner. For ease of illustration, only one programming circuit denoted as "$11i$" is illustrated. The drive transistor $10i$ is gate-controlled by a programming circuit Ci derived from the programming circuit $11i$. The other drive transistors $10_0$ to $10_m$ are gate-controlled by programming signals applied from the corresponding programming circuits. Also in this circuit, an enhancement-type MOS transistor $10_{DR}$ is provided in parallel with the drive transistors $10_0$ to $10_m$. The programming circuit $10i$ is comprised of a fuse element FC, enhancement-type MOS transistors 12 to 17, and depletion-type MOS transistors 18 to 20. The drain-source paths of the MOS transistors 12 and 13 are coupled at one end with an address signals Ai and $\overline{Ai}$, respectively. A control signal for error bit replacement generated and delivered from the control signal generator 6 (see FIG. 1) is input to the gates of the transistors 16 and 17. An output signal OUT derived from the error bit replacement control signal generator 6 is also applied to the gate of the parallel-connected transistor $10_{DR}$. The other ends of the MOS transistors 12 and 13 are connected together and the common connection point provides an output terminal connected to the gate of the drive transistor $10i$.

With such an arrangement, when the auxiliary memory is not used, the replacement signal OUT is set at logical "1". In this case, the MOS transistor $10_{DR}$ is turned on, and therefore the auxiliary memory is not selected.

When an error memory cell is present in the main memory and the auxiliary memory is used, the replacement signal OUT is logical "0". In this case, the MOS transistor $10_{DR}$ is off, so that the output signal level of the auxiliary decoder is determined by the logic levels of the gate control signals C0, C1, ..., Ci, ..., Cm. If the cell at the address location specified by the address signal A0=0 is an error bit cell, the fuse element FC is melted. Then, the gate of the MOS transistor 12 becomes logical "1" and the MOS transistor 12 is turned on. The MOS transistor 13 is turned off and its gate is logical "038 . The programming circuit $11i$ produces the input address signal Ai as the output signal Ci. Accordingly, when the logical "0" signal comes in as the input address signal Ai, the programming signal Ci from the programming circuit $11i$ is logical "0" and the drive transistor $10i$ supplied with the programming signal Ci is off. Therefore, when all other drive transistors $10_0$ to $10_m$ are off, the auxiliary memory is selected.

Let us consider a case where a memory bit cell at an address location specified by the address signal Ai=1 is an error bit cell. In this case, the fuse element FC is not burned out. Accordingly, the transistor 12 is off while the transistor 13 is on. The circuit $11i$ produces an input address signal $\overline{Ai}$ as a programming signal Ci. Accordingly, if the input address signal Ai is logical "1" (i.e., $\overline{Ai}$=0), the output signal Ci produced from the circuit $11i$ is also logical "0", so that the drive transistor $10i$ is off. Accordingly, as in the previous case, when all of the other drive transistors $10_0$ to $10_m$ are off, the auxiliary memory is selected. With this circuit construction, when an error bit cell is in address Ai=1 it is unnecessary to melt the fuse element FC. Therefore, the number of fuse elements FC to be melted becomes less in this circuit construction than in that of the FIG. 3 circuit.

As described above, in conventional semiconductor memory devices with a redundancy function as shown in FIGS. 1 to 4, current flows through the auxiliary memory and auxiliary address decoder even when they are not used, thus wasting power. When the auxiliary memory and the auxiliary address decoder are used, the corresponding main decoder circuit and main memory area are not used. In the above-mentioned semiconductor memory device, current also flows into the main decoder circuit and the main memory area, which are not being used, thus wasting more power.

By convention, in order to judge whether or not an error bit cell is present in the main memory, a memory bit cell in the main memory is selected by the main address decoder, and data is stored into the selected memory bit cell. Then, the data is read out and compared with the original data. In the case of a memory in which the power dissipation at the time of stand-by must be reduced to substantially zero, as in CMOS-RAM's (complementary MOS transistors), even a memory cell where an extremely small current flows must be treated as an error bit cell. This extremely small current may be, for example, a leak current flowing through the transistor, a leak current due to detection of a PN junction, a short current in the memory bit cell when the power source and ground are shorted by an extremely large resistor element in the memory cell, or the like. These currents are extremely small, and do not lead to the destruction of data in the memory bit cell. Therefore, the conventional detecting method judges the memory bit cell with such an extremely small current as a correct memory cell. In other words, the conventional detecting method cannot detect memory cells with an extremely small current.

SUMMARY OF THE INVENTION

Accordingly, an object of the present invention is to provide a semiconductor memory device which can prevent wasteful power dissipation due to current flow in a decoder circuit or a memory area not being used.

Another object of the present invention is to provide a semiconductor memory device which can detect a memory bit cell in which an extremely small current, such as a leak current, flows.

According to the invention, there is provided a semiconductor memory device comprising:

a main semiconductor circuit;

an auxiliary semiconductor circuit used in place of a defective portion of said main semiconductor circuit if the defective portion is present in said main semiconductor circuit; and means for disconnecting said defective circuit portion from said main semiconductor circuit.

According to the invention, there is further provided a semiconductor memory device comprising:

memory means with a plurality of memory cells arrayed in a matrix and having a main memory area and an auxiliary memory area used in place of a part of said main memory area;

a plurality of row lines connected to said memory cells for selectively specifying said memory cells;

a plurality of column lines connected to said memory cells, through which data is read out;

power source lines provided corresponding to said row lines and connected to said memory cells connected to said corresponding row lines; and means for disconnecting from said power source said power source lines, which are connected to said memory cells in the unused memory area, of the plurality of said power source lines.

DETAILED DESCRIPTION OF THE PREFERRED EMBODIMENTS

Figure 5:
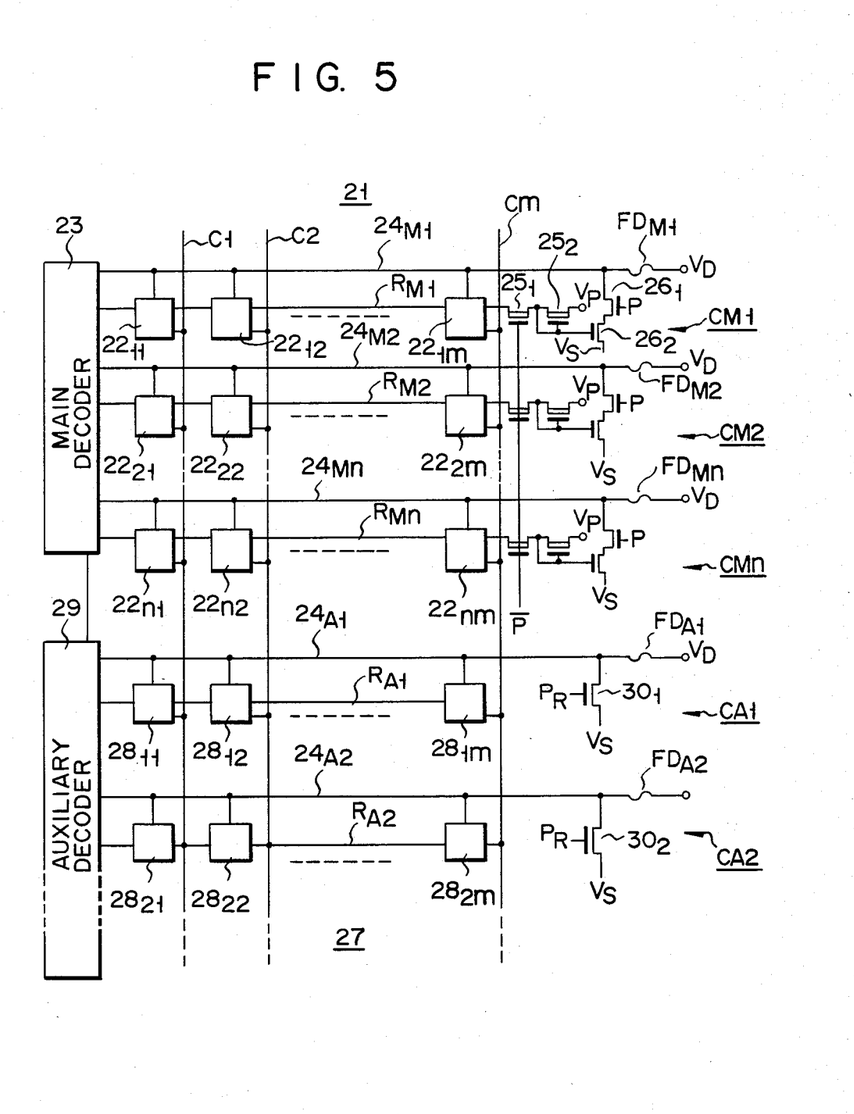
FIG. 5 shows a practical circuit arrangement of an embodiment of a semiconductor memory device according to the present invention.

FIG. 5 shows an embodiment of a semiconductor memory device according to the present invention. As shown in FIG. 5, a main memory 21 comprises memory cells $22_{11}$ to $22_{1m}$ and $22_{21}$ to $22_{2m}$ provided at intersections of a plurality of row lines $R_{M1}$ to $R_{Mn}$ and a plurality of column lines C1 to Cm. The outputs of a main row decoder 23 are connected to the row lines $R_{M1}$ to $R_{Mn}$ of the main memory 21. The main row decoder 23 decodes an input row address signal to select one of the row lines $R_{M1}$ to $R_{Mn}$. The selection of the row line, in turn, drives the memory cells connected to the selected row line. Although not shown, a column decoder is provided to decode an input column address signal to select one of the column lines C1 to Cm. Data is read out from a memory cell at the intersection of the selected row line and the selected column line. Power source lines $24_{M1}$ to $24_{Mn}$ are provided for row lines $R_{M1}$ to $R_{Mn}$, respectively. The power source lines $24_{M1}$ to $24_{Mn}$ are respectively connected to memory cells $22_{11}$ to $22_{1m}$ and $22_{21}$ to $22_{2m}$ connected to the corresponding row lines $R_{M1}$ to $R_{Mn}$, as shown. For example, the power source line $24_{M1}$ is connected to the memory cells $22_{11}$ to $22_{1m}$ connected to the corresponding row line $R_{M1}$. The power source lines $24_{M1}$ to $24_{Mn}$ are connected through fuse elements $FD_{M1}$ to $FD_{Mn}$ to a power source VD. The power source lines $24_{M1}$ to $24_{Mn}$ are provided with fusing circuits $CM_1$ to $CM_n$ for fusing the fuse elements, respectively. These fusing circuits all have the same construction, and so only the fusing circuit $CM_1$ will be described.

The fusing circuit $CM_1$ comprises two depletion-type MOS transistors $25_1$ and $25_2$ connected in series between the row line $R_{M1}$ and a high voltage power source VP, and two enhancement-type MOS transistors $26_1$ and $26_2$ connected in series between the power source line $24_{M1}$ and the reference voltage (e.g., ground) VS. The transistor $25_1$ is connected at the source to the row line $R_{M1}$ and at the drain to the source of a transistor $25_2$. The drain of the transistor $25_2$ is connected to the high power source VP. A signal $\bar{P}$ of logical "0" is applied to the gate of the transistor $25_1$ when the fuse element $FD_{M1}$ is burned out. The gate of the transistor $25_2$ is connected to the source thereof. The transistor $26_1$ is connected at the drain to the power source line $24_{M1}$ and at the source to the drain of the transistor $26_2$. The source of the transistor $26_2$ is connected to the reference voltage VS. When the fuse element $FD_{M1}$ is burned out, a signal of logical "1" is applied to the gate of the transistor $26_1$. The gate of the transistor $26_2$ is connected to the gate and the source of the transistor $25_2$.

An auxiliary memory 27 is provided for saving the main memory with an error bit. This auxiliary memory 27 is not used when the error bit cell is not contained in the main memory 21.

The auxiliary memory 27 is comprised of memory cells $28_{11}$ to $28_{1m}$ and $28_{21}$ to $28_{2m}$ provided at the intersections of row lines $R_{A1}$ to $R_{An}$ and column lines C1 to Cm. When an error bit cell is, for example, the memory cell $22_{11}$ of the memory cells $22_{11}$ to $22_{1m}$ connected to the row line $R_{M1}$, for example, in the main memory 21, the correct data to be written into the memory cells $22_{11}$ to $22_{1m}$ on the row line $R_{M1}$ is written into the memory cells $28_{11}$ to $28_{1m}$ on the row line $R_{A1}$. The outputs of an auxiliary decoder 29 are connected to the row lines $R_{A1}$ to $R_{An}$ of the auxiliary memory 27. The auxiliary decoder 29 receives an input address signal which is input to the main row decoder 23. The auxiliary decoder 29 is so programmed that when an address signal to select the row line containing the error bit cell of the main memory 21 is received, it selects a corresponding row line with a memory cell storing the correct data in the auxiliary memory 27.

In the drawing, the main memory 21 and auxiliary memory 27 are separately illustrated. They may be fabricated such that they are arranged in different memory areas within a single memory device. This can be applied to the arrangement of the decoders 23 and 29. Also in the auxiliary memory 27, power source lines $24_{A1}$ to $24_{An}$ are correspondingly provided for the row lines $R_{A1}$ to $R_{An}$, as in the main memory 21. The power source lines $24_{A1}$ to $24_{An}$ are connected to memory cells $28_{11}$ to $28_{1m}$ and $28_{21}$ to $28_{2m}$ which are connected to the corresponding row lines $R_{A1}$ to $R_{An}$. For example, the power source line $24_{A1}$ is connected to the memory cells $28_{11}$ to $28_{1m}$ connected to the row lines $R_{A1}$ corresponding to the power source line $24_{A1}$. The power source lines $24_{A1}$ to $24_{An}$ are connected to the power source VD through fuse elements $FD_{A1}$ to $FD_{An}$ made of polysilicon, for example, as in the main memory 21. Fusing circuits CA1 to CAn for fusing the fuse elements $FD_{A1}$ to $FD_{An}$ are connected to power source lines $24_{A1}$ to $24_{An}$, respectively. The fusing circuit CA1 is constructed of an enhancement-type MOS transistor 30 whose drain is connected to the power source line $24_{A1}$ and the source to the reference voltage VS. A signal of logical "1" is applied to the gate of a transistor 30 when the fuse element $FD_{A1}$ is burned out. The same is true of the fusing circuit CA1, and so no further explanations will be provided in this regard.

In the main memory 21, when the fuse elements $FD_{M1}$ to $FD_{Mn}$ are intact, that is, not burned-out, as shown in the figure, the power source voltage VD is applied through the power source lines $24_{M1}$ to $24_{M2}$ and the main memory 21 is kept in an operation mode. Similarly, when the fuse elements $FD_{A1}$ to $FD_{An}$ are kept intact in the auxiliary memory 27, the power source voltage VD is applied to the memory cells $28_{11}$ to $28_{1m}$ and $28_{21}$ to $28_{2m}$ of the auxiliary memory 27, through the power source lines $24_{A1}$ to $24_{An}$, and the auxiliary memory 27 is kept in an operation mode.

When no error bit cell is contained in the main memory 21, the auxiliary memory 27 is not used. In this case, the power source supply VD to the auxiliary memory 27 is shut off to place the auxiliary memory 27 in an inoperative mode. This results in a saving of power. In the embodiment shown in FIG. 5, the output of the power source VD to the auxiliary memory 27 is shut off by applying a signal PR of logical "1" to the gates of the transistors $30_1$ to $30_2$ of the fusing circuits CA1 to CAn. When the logical "1" signal is applied to the gates of these transistors, the transistors $30_1$ to $30_2$ are turned on, so that heavy current flows into the fuse elements $FD_{A1}$ to $FD_{An}$ connected between the transistors $30_1$ and $30_2$ and the power source voltage VD. Joule heat generated at this time burns out the fuse elements $FD_{A1}$ to $FD_{An}$. As a result, the power source lines $24_{A1}$ to $24_{An}$ are disconnected from the power source VD to shut off the power supply to the auxiliary memory 27, so that power dissipation in the auxiliary memory 27 becomes zero.

When the main memory 21 contains an error bit cell, for example, when an error bit is contained in the memory cells $22_{11}$ to $22_{1m}$ connected to the row lines $R_{M1}$, the row line $R_{M1}$ is not selected. Accordingly, in this case, power is saved by shutting off the supply of power to the memory cells $22_{11}$ to $22_{1m}$ connected to the row line $R_{A1}$. To shut off the power supply to the row line $R_{M1}$, an address input signal for selecting the row line $R_{M1}$ is input to the main row decoder 23 to select the row line $R_{M1}$. Then, the row line $R_{M1}$ is logical "1". Then, the signal $\overline{P}$ is set at logical "0" and the signal P at logical "1". As a result, the transistor $25_1$ connected to the row line $R_{M1}$ is turned off, so that the high power source voltage VP is applied to the gate of the transistor $26_2$ via the drain-source path of the transistor $25_2$. When the high power source voltage VP is applied to the gate of the transistor $26_2$ and the signal P of logical "1" (this level being the high power source voltage VP) is applied to the gate of the transistor $26_1$, the transistors $26_1$ and $26_2$ are conductive and a large current flows into the fuse element $FD_{M1}$. Joule heat generated by the flow of this large current burns out the fuse element $FD_{M1}$. The power source line $24_{M1}$ corresponding to the row line $R_{M1}$ is separated from the power source VD. As a result, the power supply to the memory cells $22_{11}$ to $22_{1m}$ is shut off to save power used for this memory device.

When the row line $R_{M1}$ is selected, the remaining row lines $R_{M2}$ to $R_{Mn}$ are in a non-selected state. In this case, the transistors associated with the row lines $R_{M2}$ to $R_{Mn}$, which correspond to the non-selected row lines $R_{M2}$ to $R_{Mn}$ are logical "0". Therefore, the fuse elements $FD_{M2}$ to $FD_{Mn}$ of the power source lines $24_{M1}$ to $24_{M2}$ corresponding to the row lines $R_{M1}$ to $R_{Mn}$ are not fused. As a result, the memory cells $22_{11}$ to $22_{1m}$ and $22_{21}$ to $22_{2m}$ coupled with the power source lines $24_{M2}$ to $24_{Mn}$ are kept in an operation mode. The power source VD may be used in place of the high power source voltage VP. When the high power source voltage VP is used, a large current is allowed to flow into the fuse elements $FD_{M1}$ to $FD_{Mn}$ even if the channel widths of the transistors $26_1$ and $26_2$ are small. When the channel widths of these transistors are large, the power source VD can be used. While in the above-mentioned embodiment the fuse elements $FD_{M1}$ to $FD_{Mn}$ were burned-out by feeding the current to the fuse elements, a laser beam may be used for burning out the fuse elements. If the laser beam is used, there is no need for the transistors $25_1$, $25_2$, $26_1$ and $26_2$ and the transistors $30_1$, $30_2$...

In the memory device of FIG. 5, the power line is separated or disconnected from the power source VD by burning the fuse element. The separation or disconnection of the power line from the power source VD is not limited to the above method. Another example for executing such power source separation will be described referring to FIGS. 6A and 6B. The circuit shown in FIGS. 6A and 6B is so designed that an enhancement-type MOS transistor 31 is provided between the power source VD and the power source line $24_{M1}$.

The power source separation is performed by turning off the MOS transistor 31.

Figure 6A:
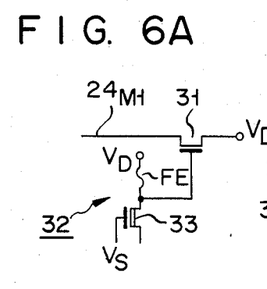
FIGS. 6A and 6B are circuit diagrams of other examples of a burning-out circuit in the memory device shown in FIG. 5, respectively.
Figure 6B:
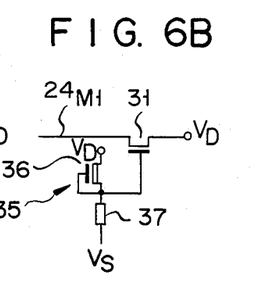

As shown in FIG. 6A, the transistor 31 is provided between the power source VD and the power source line $24_{M1}$. A control circuit 32 for controlling the transistor 31 is constructed of an MOS transistor 33 and a fuse element FE. The transistor 33 is connected at one end to the reference voltage VS and at the other terminal to the power source VD via the fuse element FE. A junction between the fuse element FE and the MOS transistor 33 is connected to the gate of the MOS transistor 31.

With such an arrangement, for separating or disconnecting the power source VD from the power source line $24_{M1}$, the fuse element FE is burned out by irradiating the fuse element with a laser beam, for example. When the fuse element FE is burned out, the gate of the MOS transistor 31 is logical "0", so that the MOS transistor 31 is off.

In the circuit of FIG. 6B, an enhancement-type MOS transistor 31 is provided between the power source VD 20 and the power source line $24_{M1}$. A control circuit 35 for controlling the transistor 31 is composed of an MOS transistor 36 and a high-resistance polysilicon 37.

The MOS transistor 36 is connected at one end to the power source VD and at the other end to the reference voltage VS through the high resistance polysilicon 37. The gate of the transistor 36 is connected to a junction between the MOS transistor 36 and the high resistance polysilicon 37. This junction is connected to the gate of the transistor 31.

With such an arrangement for shutting off the power source line $24_{M1}$ from the power source VD, the high resistance polysilicon 37 is irradiated with the laser beam, for example, to anneal the polysilicon to reduce its resistance. When the polysilicon 37 is resistance-reduced, the gate of the transistor 31 is logical "0" and this transistor is turned off. As a result, the power source line $24_{M1}$ is separated or disconnected from the power source VD.

Figure 7:
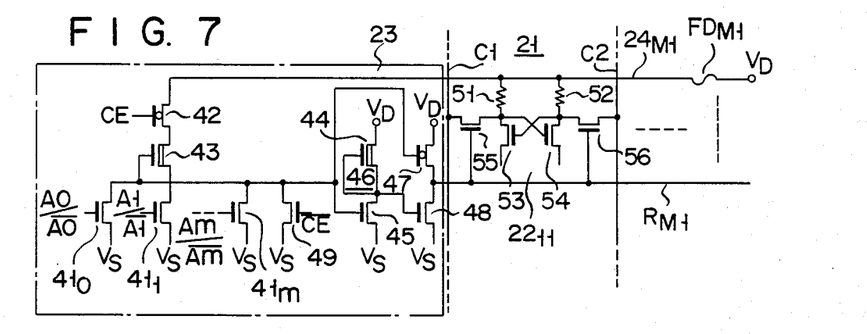
FIG. 7 shows another embodiment of a memory device according to the present invention.

FIG. 7 shows another embodiment of the memory device according to the present invention which is directed to improve the power dissipation of the memory 21 and the decoder 23 as well. To this end, the decoder as well as the memory is connected to the power source VD by way of the fuse element.

In the decoder 23, a plurality of enhancement-type MOS transistors $41_0$ to $41_n$, coupled at their first ends with the power source voltage VS, receive at their gates bit signals A0, $\overline{A0}$, ..., An, $\overline{An}$ as the input address signals. An enhancement-type MOS transistor 42 and a depletion-type MOS transistor 43 are connected in series between the second ends of the transistors $41_0$ to $41_n$ and the power source line $24_{M1}$. An inverter 46 comprises a depletion-type MOS transistor 44 and an enhancement-type MOS transistor 45, which are provided between the power source VD and the reference voltage VS. A couple of enhancement-type MOS transistors 47 and 48 are connected in series between the power source VD and the reference voltage VS. An enhancement-type MOS transistor 49 is connected across the MOS transistors $41_0$ to $41_m$. The gates of the MOS transistors 43, 45 and 47 are connected to the second ends of the MOS transistors $41_0$ to $41_m$, respectively. The gate of the transistor 48 is connected to the output terminal of the inverter 46, i.e., a junction of the transistors 44 and 45. A chip enable signal CE and the level inverted signal $\overline{CE}$ are applied to the gates of the transistors 42 and 49, respectively.

In a memory cell $22_{11}$ of the memory 21, enhancement-type MOS transistors 53 and 54 are connected at their first ends to the reference voltage VS and at their second ends to the power source line $24_{M1}$ via resistors 51 and 52. An enhancement-type MOS transistor 55 is connected at its first end to the gate of the MOS transistor 54 and a junction between the resistor 51 and the transistor 53, and at its second end to the column line C1. A transistor 56 is connected at its first end to a junction of the resistor 52 and the transistor 54, and at its second end to the column line C2, and at its gate to the row line $R_{M1}$. The power source line $24_{M1}$ is connected to the power source VD via the fuse element $FD_{M1}$. The threshold voltages of the transistors 42 and 47 are set at substantially 0 V.

With such an arrangement, when the memory cell $22_{11}$ is an error bit cell, the fuse element $FD_{M1}$ is burned out by the laser radiation. After the fuse element is burned out, the power source line $24_{M1}$ is separated or disconnected from the power source VD, so that the power supply not only to the memory cell $22_{11}$, but also to the decoder 23, is shut off. The circuit shown in FIG. 7 is applicable for an arrangement of the auxiliary decoder and the auxiliary memory. More specifically, when an error bit cell is not found in the main memory, the auxiliary memory and the main memory are not used. Accordingly, in this case, the fuse element provided between the power source line connected to the auxiliary decoder and the auxiliary memory is cut off (by a laser beam, for example). As a result, the power supply to both the auxiliary memory and the main memory is shut off. In this way power dissipation, which is caused by the current flowing into the auxiliary memory and the auxiliary decoder, is prevented. In the embodiment of FIG. 7, a row line including an error bit cell is not selected by any address input signal. Therefore, it is unnecessary to apply a signal to the main decoder to make it inoperative when the auxiliary decoder is selected and the auxiliary memory cell is selected.

Figure 8:
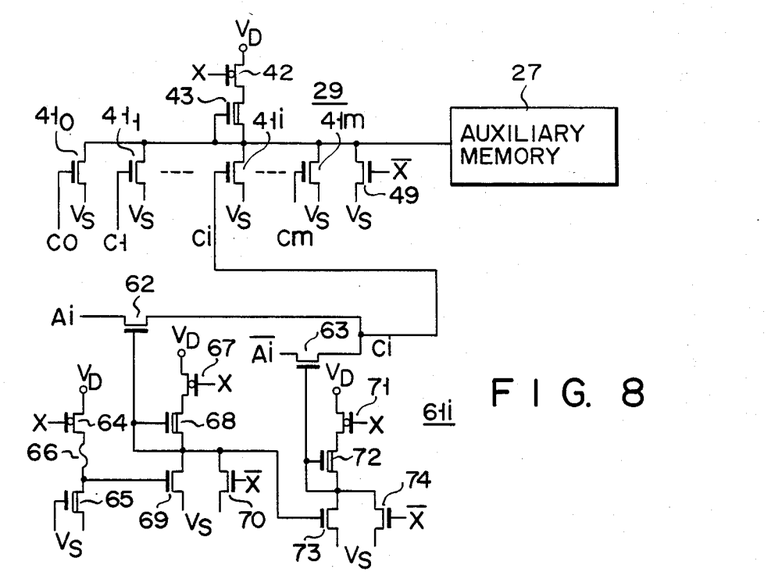
FIG. 8 shows a practical circuit arrangement of another embodiment of the present invention.

FIG. 8 shows an instance in which the present invention is applied for the programming circuit for programming the data into the main row decoder 23. The auxiliary decoder 29 comprises enhancement-type MOS transistors $41_0$ to $41_m$ which receive control signals C0 to Cn and are connected at first ends to the reference voltage VS, an enhancement-type MOS transistor 49 connected in parallel to these MOS transistors $41_0$ to $41_{1m}$, and an enhancement-type MOS transistor 42 and a depletion-type MOS transistor 43, which are connected in series between the power source VD and the second ends of the MOS transistors $41_0$ to $41_m$. A control signal X for error bit replacement is applied to the gate of the MOS transistor 42. Another control signal $\overline{X}$, which is complementary to the control signal X, is applied to the gate of the MOS transistor 49. The gate of the MOS transistor 43 is connected to the second ends of the MOS transistors $41_0$ to $41_m$.

In the programming circuit $61i$, enhancement-type MOS transistors 62 and 63 receive at first ends bit signals Ai and $\overline{Ai}$ of the input address signal and are connected at the second ends to the gate of an MOS transistor $41i$. A first series circuit is comprised of an enhancement-type MOS transistor 64 whose first end is connected to the power source VD and which receives at the gate the control signal X, a depletion-type MOS transistor 65 whose gate and first end are connected to the reference voltage VS, and a fuse element 66 made of polysilicon, for example, and connected to the second ends of the MOS transistors 64 and 65. An enhancement-type MOS transistor 67, a depletion-type MOS transistor 68, and an enhancement-type MOS transistor 69 are connected in series between the power source VD and the reference voltage VS to form a second series circuit. An enhancement-type MOS transistor 70 is connected in parallel with the MOS transistor 69. A third series circuit is comprised of an enhancement type MOS transistor 71, a depletion-type MOS transistor 72, and an enhancement-type MOS transistor 73, which are connected in series in this order between the power source VD and the reference voltage VS. An enhancement-type MOS transistor 74 is connected in parallel with the MOS transistor 73. A control signal X is applied to the gate of the MOS transistor 71. A complementary control signal $\overline{X}$ is applied to the gates of the MOS transistors 70 and 74

The gate of the MOS transistor 68 is connected to a junction between the MOS transistors 68 and 69 and the gate of the MOS transistor 62. The gate of the MOS transistor 72 is connected to a junction of the MOS transistors 72 and 73 and the gate of the MOS transistor 63. The gate of the MOS transistor 69 is connected to the junction between the fuse element 66 and the MOS transistor 65. The gate of the MOS transistor 73 is connected to a junction of the MOS transistors 68 and 69. The transistors 42, 64, 67 and 71 have threshold voltages of substantially 0 V. Although only one programming circuit (denoted as Ai) is illustrated in FIG. 8, all the drive MOS transistors $41_0$ to $41_m$ are actually provided with programming circuits of this type.

With such an arrangement, when the auxiliary memory is not used, the control signal X becomes logical "0". As a result, the transistors whose gates receive the control signal X are turned off to prevent useless power dissipation in the circuit 61i.

Figure 9:
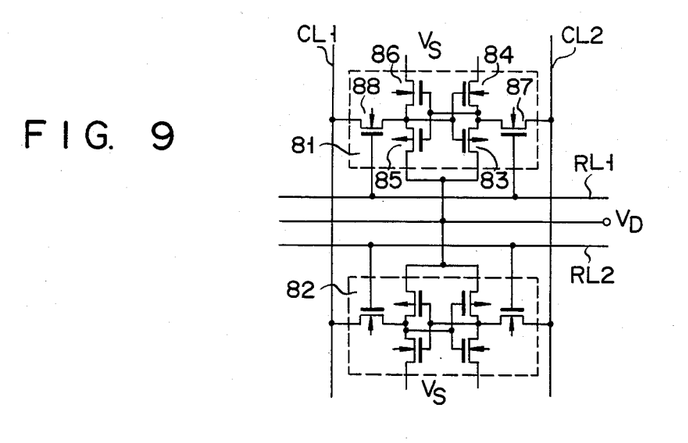
FIGS. 9 and 10 show a practical circuit arrangement of other embodiment of the present invention.
Figure 10:
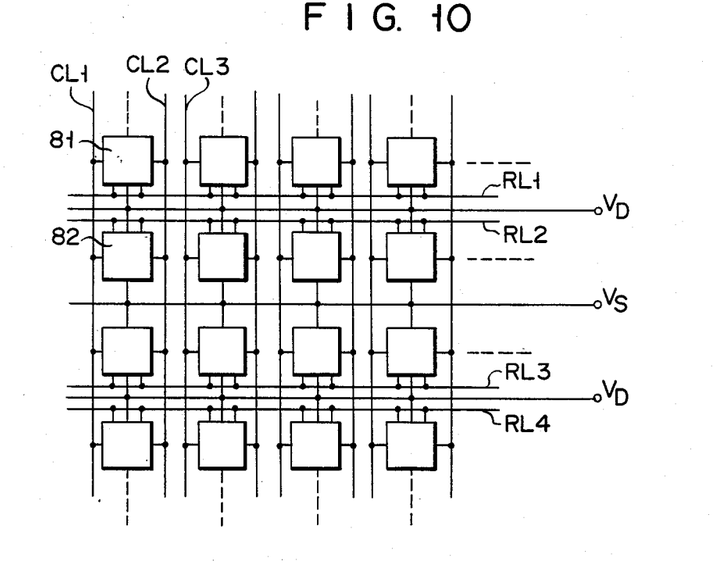

FIGS. 9 and 10 illustrate cases in which the present invention is applied to a random access memory (RAM). In FIG. 9 a RAM cell 81 comprises a first series circuit, a second series circuit, an enhancement-type N channel MOS transistor 87, and an enhancement-type N channel MOS transistor 88. The first series circuit is made up of P- and N-channel MOS enhancement-type transistors 83 and 84, which are connected in series between the power sources VD and VS. The second series circuit is made up of P- and N-channel enhancement-type MOS transistors 85 and 86, which are also connected in series between the power sources VD and VS. The MOS transistor 87 is connected between one (CL2) of the two column lines through which data is written into or read from the RAM cell 81 and a junction of the MOS transistors 83 and 84. The MOS transistor 88 is connected to the other column line (CL1) and a junction of the MOS transistors 85 and 86. A junction of the MOS transistors 83 and 84 of the first series circuit is connected to the gates of the MOS transistors 85 and 86 in the second series circuit. Similarly, a junction of the MOS transistors 85 and 86 in the second series circuit is connected to the gates of the MOS transistors 83 and 84 in the first series circuit. The gates of the MOS transistors 87 and 88 are connected to the corresponding row line $R_{L1}$. The RAM cell 82 is substantially the same as the RAM cell 81, except that it is connected to the row line $R_{L2}$ disposed in opposition to the row line $R_{L1}$. Therefore, although its arrangement is illustrated, no further explanation thereof will be given.

As shown in FIGS. 9 and 10, in the static RAM, in order to improve the integration density of the memory device RAM cells connected to two adjacent row lines are arranged in opposition to each other for each pair, while commonly coupling with a single row line. In the memory device of this type in which a single power source line is commonly used for each pair of RAM cells, when an error bit cell is present in only the memory cells connected to one of the pair of row lines, the correct data of two row lines are written into the auxiliary memory. Then, the power source line commonly used is disconnected from the power source VD to lessen power dissipation.

Figure 11:
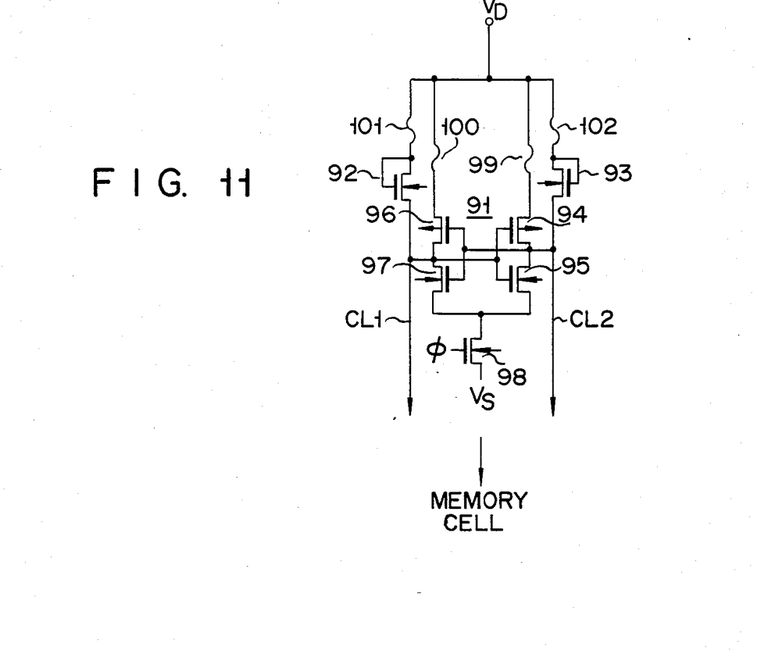
FIGS. 11 and 12 show circuit diagrams of other embodiments of the present invention.

FIG. 11 shows a circuit arrangement with a sense amplifier 91 connected between two column lines and load MOS transistors 92 and 93 respectively provided to two column lines CL1 and CL2. The sense amplifier 91 is comprised of a first series circuit, a second series circuit, and an enhancement-type MOS transistor 98 inserted between the first and second series circuits. The first series circuit is made up of two enhancement-type MOS transistors 94 and 95 of P- and N-channel type connected between the power source VD and the reference voltage VS. The second series circuit is made up of two enhancement-type MOS transistors 96 and 97 of P- and N-channel type connected in series between the reference voltage VS and the power source VD. A junction between the first and second MOS transistors 94 and 95 in the first series circuit is connected to the column line CL2 and to the gates of the MOS transistors 96 and 97. A junction between the MOS transistors 96 and 97 of the second series circuit is connected to the other column line CL1 and the gates of the MOS transistors 94 and 95 of the first series circuit. A control signal $\theta$ is applied to the gate of the MOS transistor 98. An enhancement-type load MOS transistor 92 is inserted in the column line. The gate of the MOS transistor 92 is connected to its drain. Similarly, an enhancement-type load MOS transistor 93 is inserted in the other column lines CL2. The gate of the MOS transistor 93 is connected to its drain. In the circuit shown in FIG. 11, fuse elements 99 and 100 which are made of polysilicon are connected between the transistors 94 and 96 and the power source VD. Fuse elements 101 and 102 made of high resistance polysilicon are inserted between the load transistors 92 and 93 and the power source VD in the column lines CL1 and CL2.

With such an arrangement, it is assumed that DC current flows from the power source VD to the power source voltage VS through the transistors 92 and 93 or the sense amplifier 91. The fuse elements 101 and 102 or 99 and 100 are burned-out to separate or disconnect the memory cells not used, i.e., the memory cells connected to the burned fuse elements, (connected to the column lines CL1 and CL2), thereby lessening the power dissipation.

Unlike the preceding embodiments in which the memory cells corresponding to one row line of the main memory are replaced with the auxiliary memory cells, in the FIG. 11 embodiment, the memory cells corresponding to one column line in the main memory are replaced with the auxiliary memory cells. Therefore, in the FIG. 11 embodiment, the auxiliary memory cells are arranged in a column direction.

Figure 12:
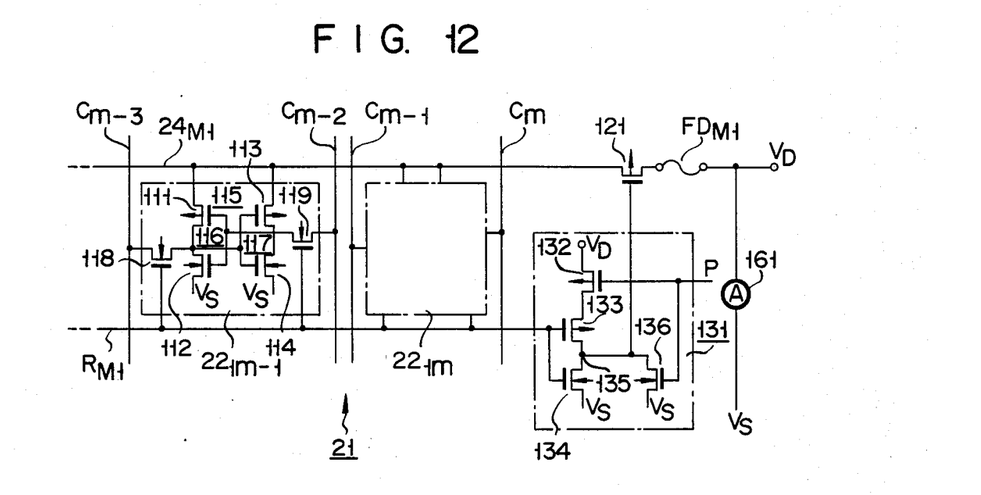

Turning now to FIG. 12 another embodiment of the present invention is shown. In FIG. 12, there is illustrated only a part of the main memory 21 connected to a control circuit 131. A memory cell $22_{1m-1}$ comprises a p-channel MOS transistor 111 and an N-channel MOS transistor 112 and a similar pair of transistors consisting of a P-channel MOS transistor 113 and an N-channel MOS transistor 114, which are respectively connected in series between the power source line $24_{M1}$ and the reference voltage VS, as shown. A pair of CMOS inverters 116 and 117 together form a filp-flop 115. N-channel MOS transistors 112 and 119 for the transfer gates are inserted between the flip-flop 115 and a pair of column lines $C_{m-3}$ to $C_{m-2}$.

One end of the power source line $24_{M1}$ for the power source VD supply is connected to the power source VD applying point through a P-channel MOS transistor 121 and the fuse element $FD_{M1}$ made of aluminum or polysilicon. The MOS transistor 121 is controlled by the output of a control circuit 131 receiving a signal on the row line $R_{M1}$ and the control signal P.

An arrangement of the control circuit 131 is as follows. A P-channel MOS transistor 132, a P-channel MOS transistor 133, and an N-channel MOS transistor 134 are connected in series in this order between the power source VD applying point and the voltage VS applying point. The control signal P is applied to the gate of the MOS transistor 132, and the signal on the row line $R_{A1}$ is applied to the gates of the MOS transistors 132 and 134. An N-channel MOS transistor 136 which receives the control signal P at its gate is connected between a node 135 of both MOS transistors 133 and 134 and the voltage VS applying point. A signal on the node 135 is applied to the gate of the MOS transistor 121. The circuit arrangement of this memory cell is applied to those of the remaining memory cells on each row line.

With such an arrangement, it is possible to find an error bit cell suffering from a leak current from the memory cells on each row line. The method of finding the error bit cell will now be described. The control signal P is set at logical "0" and successive address signals are sequentially applied to the address buffer. In response to the logical "0" of the control signal P, the MOS transistor 132 in the control circuit 131 is on, while the MOS transistor 133 is off. As a result, the signal on the row lines $R_{M1}$ is inverted by the CMOS inverter composed of the MOS transistors 133 and 134, and is then applied to the gate of the MOS transistor 121. As the result of the sequential inputting of the successive address signal to the address buffer, the row lines $R_{M1}$ to $R_{Mn}$ in the main memory 21 are driven in a sequential manner. It is assumed that the row line $R_{M1}$ is driven in FIG. 12. In this case, the signal on the row line $R_{M1}$ is logical "1", the signal at the node 35 is logical "0" and the MOS transistor 121 is on. Accordingly, the power source VD is supplied to the power source line $24_{M1}$ through the fuse elements $FD_{m1}$ and the MOS transistor 121 which is in an on state. At this time, only one row line is driven and only one power source line $24_{M1}$ is supplied with the power source VD. Therefore, it is possible to find an error bit cell in the plurality of memory cells $22_{11}$ to $22_{1m}$ and $22_{21}$ to $22_{2m}$ connected to the row line $R_{A1}$ now being driven by inserting a current measuring means, for example, an ammeter 161 which is sensitive to an extremely small current, between the VD applying point and the voltage VS applying point, and measuring a DC current flowing through the power source VD. If an error bit cell is contained, the ammeter reads 200 nA or more. Depending on the standard of LSI, the leak current for a good memory cell may be from approximately 0 to 200 nA, and that for an error bit cell 200 nA or more. In this instance, the power source line $24_{M1}$ coupled with the memory cells $22_{11}$ to $22_{1m}$ of one row line containing the error bit cell is separated or disconnected from the power source VD by burning the fuse elements $FD_{M1}$ with a laser beam.

If an error bit cell is not contained in the memory cells $22_{11}$ to $22_{1m}$ on the row line $R_{M1}$ being driven, only 0 to 200 nA flow into the ammeter 161. In this case, the fuse element $FD_{M1}$ is intact. Every time the address signal is changed to drive another row line of those $R_{M2}$ to $R_{Mn}$, the DC current is measured by the ammeter 161. By using this current value, it is possible to determine whether or not one of these fuse elements $FD_{M2}$ to $FD_{Mn}$ is burned out or not. After this operation is performed for all the row lines $R_{M1}$ to $R_{Mn}$, it is possible to separate or disconnect the memory cells of each line containing an error bit cell. In order to burn the fuse elements $FD_{M1}$ to $FD_{Mn}$, it is necessary to replace the memory cells of one row line containing the error bit cell with the memory cells in the auxiliary memory 27. At the same time, the auxiliary decoder 29 is programmed. If this is done, no current flows into the memory cells of one row line containing the error bit, resulting in a saving of power. Further, since these memory cells may be replaced by those in the auxiliary memory 27, the main memory containing the error bit cell suffering from the leak current can be saved. After finding the error bit cell, the control signal P is set at logical "1". The result is that the MOS transistor 136 is on and the MOS transistor 132 is off, and the MOS transistor 121 is on irrespective of the signal on the row line $R_{M1}$. Accordingly, the power source VD is supplied via the power source lines $24_{M1}$ to $24_{Mn}$ to the fusing circuits $CM_1$ to $CM_n$ of one row line whose fuse elements $FD_{M1}$ to $FD_{Mn}$ are not burned out. As a result, the memory cells connected to the power source lines are rendered accessible.

As shown in FIG. 9, the memory cell connected to two adjacent row lines frequently employs a single power source line for power source VD supply, due to restrictions in designing the pattern layout of the memory device. With this arrangement, it is sufficient to provide the control circuit 131 for either of the row lines. In this case, however, the memory cells for the two row lines which are provided for one power supply line are replaced with the memory cells in the auxiliary decoder 29.

In the case shown in FIG. 12, the normal error bit cell can be found in a manner similar to the conventional manner. That is, the error bit cell is replaced with one in the auxiliary memory 27, thereby saving the main memory containing an error bit cell.

Figure 13:
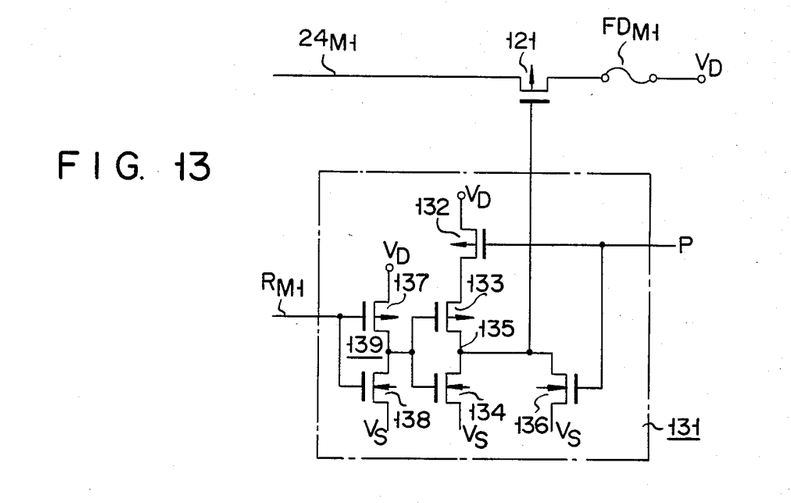
FIGS. 13 and 14 show practical circuit arrangements of two embodiments of a separation circuit used in the embodiment of FIG. 12.

FIG. 13 shows another embodiment of the invention using a unique control circuit 131 which is different from that previously mentioned. In the control circuit 131, a CMOS inverter 139 including a P-channel MOS transistor 137 and an N-channel MOS transistor 138 is provided between the row line $R_{M1}$ and a node on the common gate of the MOS transistors 133 and 134.

In a memory device having the control circuit 131 thus arranged for each row line, when the control signal P is logical "0", the MOS transistor 132 is on and the MOS transistor 136 is off. At this time, the signal on the row line $R_{M1}$ is sequentially inverted by the CMOS inverter 139 and a CMOS inverter including a P-channel MOS transistor 133 and an N-channel MOS transistor 134, and is then applied to the gate of the MOS transistor 121. Accordingly, in this embodiment, only the MOS transistor 121 relating to the row line 121 is off, while the transistors (not shown) on the remaining row lines are all on.

In this embodiment, when the memory cell has the leak current, the MOS transistor 121 on all the nonselected row lines are on if the control signal P is set at logical "0." Under this condition, a suitable current measuring means such as the ammeter 161 set between the power source VD applying point and the power source VS applying point could read 200 nA or more. Then, an address signal is successively applied to the address buffer to drive the row lines $R_{M1}$ to $R_{Mn}$. Then, only the MOS transistor 121 relating to the row lines $R_{M1}$ to $R_{Mn}$ is on. Assume now that the row line containing an error bit cell is driven and its related MOS transistor 121 is turned off. At this time, 200 nA flowing between the power sources VD and VS decreases to approximately 0 to 200 MA. Thus, it is possible to find the row line containing the error bit cell by observing a current change between the power sources VD and VS. After finding the error bit cell, the memory cells on the row line containing the error bit cell can be permanently separated or disconnected from the power source VD by burning the fuse element relating to the row line, as in the previous case.

Figure 14:
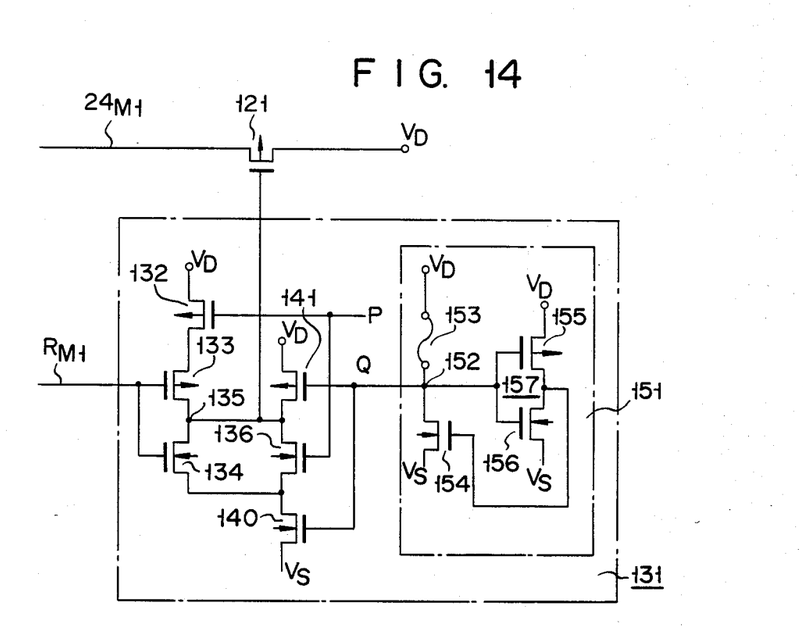

The embodiments of FIGS. 12 and 13 each employ the fuse element connected in series to the MOS transistor 121 for permanently separating or disconnecting the memory cells of one row line containing the error bit cell from the power source VD. The same result can also be achieved by placing the main memory 21 in an off state irrespective of the control signal P. FIG. 14 shows yet another embodiment of the invention which corresponds to the embodiment of FIG. 12 without the fuse element $FD_{M1}$. The control circuit 131 is constructed as follows. In the control circuit 131 of the present embodiment, each of the MOS transistors 134 and 136 is connected to the power source VS applying point through an N-channel MOS transistor 140. A P-channel MOS transistor 141 is inserted between the node 135 and the power source VD applying point. An output signal Q is applied from a separation control circuit 151 to the gate of the MOS transistors 140 and 141.

In the separation control circuit 151, a fuse 153 is inserted between the power source VD applying point and the signal Q output point 152, and an N-channel MOS transistor 154 is inserted between the output point 152 and the power source voltage VS applying point. A signal at the output point 152 is supplied to the gate of the N-channel MOS transistor 154 through a CMOS inverter 157 comprised of a P-channel MOS transistor 155 and an N-channel MOS transistor 156. Also in the separation control circuit 151, a ratio of a resistance of the fuse 153 to an on-resistance of the MOS transistor 154 is properly set, and a logical "1" signal is obtained as the signal Q.

With such an arrangement, if the fuse 153 is not burned-out, the output signal Q from the separation control circuit 151 is set at logical "1". Then, the MOS transistor 140 is on and the MOS transistor 141 is off. The control circuit 131 operates in substantially the same manner as the control circuit 131 in FIG. 12. When an error bit cell is present, the fuse 153 in the control circuit 151 is burned out. At this time, since the power source VD is not supplied to the node 152, the node 152 is discharged to the power source voltage VS. When the node 152 is logical "0", the output of the CMOS inverter 157 is logical "1" to turn on the MOS transistor 154. The output signal Q at the output point 152 is kept at logical "0". The result is that the MOS transistor 140 is off, the MOS transistor 141 is on, and the signal at the node 135 is set at logical "1" by the MOS transistor 140. Thus, since the MOS transistor 140 is turned off by the signal Q, the signal at the node 135 is never set at logical "0" regardless of the level of the control signal P. As a result, the MOS transistor 121 remains off because the signal at the node 135 is logical "1", so that the power source line $24_{M1}$ is permanently separated or disconnected from the power source VD.

As described above, according to the present invention, current flow into unused circuitry is prevented. Because of this, power dissipation in the memory device is improved.

Further, according to the present invention, it is possible to detect the memory cell having a leak current. This feature makes the memory device adaptable for CMOSRAM.

It should be understood that the present invention is not limited to the embodiments described above, but may be changed and modified without changing the scope of the invention.

What we claim is:

1. An error correction semiconductor memory device coupled to a power source comprising:
    a main memory including a plurality of memory cells arranged in a matrix of rows and columns, one of said memory cells which does not operate correctly being an error bit cell;
    an auxiliary memory used as a redundance memory including a plurality of auxiliary memory cells arranged in a matrix of rows and columns;
    a plurality of main row lines each connected to said main memory cells in a different row of said main memory;
    a plurality of auxiliary row lines each connected to said auxiliary memory cells in a different row of said auxiliary memory, each of said auxiliary row lines corresponding to a different row line in said main memory;
    a plurality of column lines each commonly connected to said main memory cells and auxiliary memory cells in different corresponding columns of said main and auxiliary memories;
    a plurality of power source lines connected to said power source, each of said power source lines being connected to a different one of said main row lines and auxiliary row lines;
    an enhancement type MOS transistor connected between said power source and the power source line corresponding to the row line connected to said error bit cell of said main memory; and
    means for turning off said enhancement type MOS transistor for disconnecting said corresponding power source line from said power source, said turning off means including a depletion type MOS transistor and a resistance element connected in series between a predetermined potential and a reference potential, one terminal of the source-drain path of said depletion type MOS transistor being connected to said predetermined potential and the other terminal of the source-drain path and the gate of said depletion type MOS transistor being connected to one terminal of said resistance element, the other terminal of said resistance element being connected to said reference potential, and the junction of said other terminal of said source-drain path of said depletion type MOS transistor and said one terminal of said resistance element being connected to the gate of said enhancement type MOS transistor, wherein said corresponding power source line is disconnected from said power source at times when said error bit cell is detected.

2. An error correction semiconductor memory device coupled to a power source comprising:
a main memory including a plurality of memory cells arranged in a matrix of rows and columns, one of said memory cells which does not operate correctly being an error bit cell;
an auxiliary memory used as a redundancey memory and including a plurality of auxiliary memory cells arranged in a matrix of rows and columns;
a plurality of main row lines each connected to said main memory cells in a different row of said main memory;
a plurality of auxiliary row lines each connected to said auxiliary memory cells in a different row of said auxiliary memory, each of said auxiliary row lines corresponding to a different row line in said main memory;
a plurality of column lines each commonly connected to said main memory cells and auxiliary memory cells in different corresponding columns of said main and auxiliary memories;
a plurality of power source lines connected to said power source, each of said power source lines being connected to a different one of said main row lines and auxiliary row lines;
an enhancement type MOS transistor connected between said power source and the power source line corresponding to the row line connected to said error bit cell of said main memory; and
means for turning off said enhancement type MOS transistor for disconnecting said corresponding power source line form said power source, said turning off means including a fuse element and a depletion type MOS transistor connected in series between a predetermined potential and a reference potential, one terminal of said fuse element being connected to said predetermined potential and the other terminal of said fuse element being connected to one terminal of the source-drain path of said depletion type MOS transistor, the other terminal and the gate of said source-drain path of said depletion type MOS transistor being connected to said reference potential, and the junction of said other terminal of said fuse element and said one terminal of said source-drain path of said depletion type MOS transistor being connected to the gate of said enhancement type MOS transistor, wherein said corresponding power source line is disconnected from said power source at times when said error bit cell is detected.

3. An error correction semiconductor memory device coupled to a power source comprising:
a main memory including a plurality of memory cells arranged in a matrix of rows and columns, one of said memory cells which does not operate correctly being an error bit cell;
an auxiliary memory used as a redundance memory including a plurality of auxiliary memory cells arranged in a matrix of rows and columns;
a plurality of main row lines each connected to said main memory cells in a different row of said main memory;
a plurality of auxiliary row lines each connected to said auxiliary memory cells in a different row of said auxiliary memory, each of said auxiliary row lines corresponding to a different row line in said main memory;
a plurality of column lines each commonly connected to said main memory cells and auxiliary memory cells in different corresponding columns of said main and auxiliary memories;
a plurality of power source lines connected to said power source, each of said power source lines being connected to a different one of said main row lines and said auxiliary row lines;
a fuse element connected between said power source and the power source line corresponding to the main row line connected to said error bit cell of said main memory;
means for flowing an electric current through said fuse element to blow it, said electric current flowing means including first and second depletion type MOS transistors and third and fourth enhancement type MOS transistors, said first and second transistors being connected in series between a predetermined potential and said main row line connected to said error bit cell, one terminal of the source-drain path of said first transistor being connected to said predetermined potential and the other terminal being connected to one terminal of the source-drain path of said second transistor, the other terminal of said source-drain path of said second transistor being connected to said main row line connected to said error bit cell, the gate of said first transistor being connected to the junction of said other terminal of said source-drain path of said first transistor and said one terminal of said source-drain path of said second transistor and also being connected to the gate of said third transistor, the gate of said second transistor being connected to a potential of a first predetermined logic level so as to be turned off, said third and fourth transistors being connected in series between a reference potential and said power source line connected to said error bit cell, one terminal of the source-drain path of said third transistor being connected to said reference potential and the other terminal being connected to one terminal of the source-drain path of said fourth transistor, the other terminal of said source-drain path of said fourth transistor being connected to said corresponding power source line, the gate of said fourth transistor being connected to a potential of a second predetermined logic level complementary to said first predetermined logic level so as to be turned on, wherein when said potentials of said first and second predetermined logic levels are applied, said fuse element is blown thereby disconnecting said main memory at times when said error bit cell is detected.

4. An error correction semiconductor memory device according to claim 3, further comprising:
means for detecting said error bit cell including first to third enhancement type MOS transistors of a first channel type and fourth and fifth enhancement type MOS transistors of a second channel type, said first, second and fourth transistors being connected in series between said power source and a reference potential, one terminal of the source-drain path of said first transistor being connected to said power source and the other terminal being connected to one terminal of the source-drain path of said second transistor, the other terminal of the source-drain path of said second transistor being connected to one terminal of the source-drain path of said fourth transistor, the other terminal of the source-drain path of said fourth transistor being connected to said reference potential, one terminal of the source-drain path of said third transistor being connected to said corresponding power source line and the other terminal being connected to said power source, one terminal of the source-drain path of said fifth transistor being connected to the junction of said other terminal of said source-drain path of said second transistor and said one terminal of said source-drain path of said fourth transistor and to the gate of said third transistor, the other terminal of the source-drain path of said fifth transistor being connected to said reference potential, the gate of said first transistor being connected to the gate of said fifth transistor and a potential of a predetermined logic level, the gate of said second transistor being connected to the gate of said fourth transistor and to said row line connected to said error bit cell.

5. An error correction semiconductor memory device according to claim 3, further comprising:

means for detecting said error bit cell including first to fourth enhancement type MOS transistors of a first channel type and fifth to seventh enhancement type MOS transistors of a second channel type, said first and fifth transistors being connected in series between a power source and a reference potential, one terminal of the source-drain path of said first transistor being connected to said power source and the other terminal being connected to one terminal of the source-drain path of said fifth transistor, the other terminal of the source-drain path of said fifth transistor being connected to said reference potential, said second, third and sixth transistors being connected in series between said power source and said reference potential, one terminal of the source-drain path of said second transistor being connected to said power source and the other terminal being connected to one terminal of the source-drain path of said third transistor, the other terminal of the source-drain path of said third transistor being connected to one terminal of the source-drain path of said sixth transistor, the other terminal of the source-drain path of said sixth transistor being connected to said reference potential, one terminal of said source-drain path of said fourth transistor being connected to said corresponding power source line and the other terminal being connected to said power source, one terminal of the source-drain path of said seventh transistor being connected to the junction of said other terminal of said source-drain path of said third transistor and said one terminal of said source-drain path of said sixth transistor and to the gate of said fourth transistor, the other terminal of the source-drain path of said seventh transistor being connected to said reference potential, the gate of said first transistor being connected to the gate of said fourth transistor and to said row line connected to said error bit cell, the gate of said third and sixth transistors being connected to the junction of said other terminal of said source-drain path of said first transistor and said one terminal of said source-drain path of said fifth transistor, and the gate of said second transistor being connected to the gate of said seventh transistor and to a potential of a predetermined logic level.

* * * * *

UNITED STATES PATENT AND TRADEMARK OFFICE
CERTIFICATE OF CORRECTION

PATENT NO. : 4,639,895

DATED : January 27, 1987

INVENTOR(S) : HIROSHI IWAHASHI ET AL.

It is certified that error appears in the above-identified patent and that said Letters Patent is hereby corrected as shown below:

Col. 16, line 34, "redundance" should be --redundancy--.

Col. 17, line 18, "redundancey" should be --redundancy--.

Signed and Sealed this

Fifteenth Day of December, 1987

Attest:

DONALD J. QUIGG

*Attesting Officer*     *Commissioner of Patents and Trademarks*